United States Patent
Chen

(10) Patent No.: US 9,472,267 B2
(45) Date of Patent: Oct. 18, 2016

(54) STATIC RANDOM ACCESS MEMORY

(71) Applicant: Semiconductor Manufacturing International (Shanghai) Corporation, Shanghai (CN)

(72) Inventor: Jinming Chen, Shanghai (CN)

(73) Assignee: SEMICONDUCTOR MANUFACTURING INTERNATIONAL (SHANGHAI) CORPORATION (CN)

( * ) Notice: Subject to any disclaimer, the term of this patent is extended or adjusted under 35 U.S.C. 154(b) by 0 days.

(21) Appl. No.: 14/825,072

(22) Filed: Aug. 12, 2015

(65) Prior Publication Data

US 2016/0055902 A1 Feb. 25, 2016

(30) Foreign Application Priority Data

Aug. 19, 2014 (CN) .......................... 2014 1 0409377

(51) Int. Cl.
*G11C 11/419* (2006.01)
*G11C 5/06* (2006.01)
*G11C 11/412* (2006.01)
*G11C 7/10* (2006.01)

(52) U.S. Cl.
CPC ............ *G11C 11/412* (2013.01); *G11C 11/419* (2013.01); *G11C 5/06* (2013.01); *G11C 7/1069* (2013.01)

(58) Field of Classification Search
CPC ...... G11C 11/419; G11C 7/1069; G11C 5/06
USPC ............... 365/154, 155, 156, 230.05, 189.15
See application file for complete search history.

(56) References Cited

U.S. PATENT DOCUMENTS

| 5,384,734 | A | * | 1/1995 | Tsujihashi et al. ....... 365/189.04 |
| 5,424,995 | A | * | 6/1995 | Miyazaki et al. ........ 365/230.05 |
| 8,072,818 | B2 | * | 12/2011 | Chang et al. .......... 365/189.011 |
| 2002/0163839 | A1 | * | 11/2002 | Jeung ....................... 365/189.05 |
| 2007/0297249 | A1 | * | 12/2007 | Chang et al. ............. 365/189.11 |
| 2008/0031037 | A1 | * | 2/2008 | Takeda .......................... 365/182 |
| 2009/0046503 | A1 | * | 2/2009 | Luk .......................... G11C 11/36 365/175 |
| 2010/0315862 | A1 | * | 12/2010 | Huang et al. .................. 365/156 |
| 2011/0007557 | A1 | * | 1/2011 | Niki et al. ..................... 365/154 |
| 2011/0044094 | A1 | * | 2/2011 | Houston ....................... 365/154 |
| 2013/0141962 | A1 | * | 6/2013 | Liaw ............................. 365/154 |
| 2013/0201766 | A1 | * | 8/2013 | Feki ......................... 365/189.02 |
| 2014/0347908 | A1 | * | 11/2014 | Liaw ............................... 365/72 |
| 2015/0380078 | A1 | * | 12/2015 | Liaw .................... G11C 11/419 |

* cited by examiner

*Primary Examiner* — Ly D Pham
(74) *Attorney, Agent, or Firm* — Innovation Counsel LLP

(57) ABSTRACT

A static random access memory includes a first inverter and a second inverter, a first n-type metal-oxide-semiconductor (NMOS) transistor, and a second NMOS transistor. An output terminal of the first inverter is connected to an input terminal of the second inverter, and an input terminal of the first inverter is connected to an output terminal of the second inverter. The first NMOS transistor is configured to control a write signal, and the second NMOS transistor is configured to control a read signal. The first NMOS transistor is connected to the input terminal of the first inverter, the output terminal of the second inverter, a write word line, and a write bit line. The second NMOS transistor is connected to the output terminal of the first inverter, the input terminal of the second inverter, a read word line, and an internal line.

12 Claims, 2 Drawing Sheets

STATIC RANDOM ACCESS MEMORY

CROSS-REFERENCE TO RELATED APPLICATION

This application claims priority to Chinese Patent Application No. 201410409377.2 filed on Aug. 19, 2014, the disclosure of which is incorporated herein by reference in its entirety.

BACKGROUND

1. Technical Field

The present disclosure relates to the field of semiconductors, and more particularly to a static random access memory.

2. Description of the Related Art

Existing static memory devices in the prior art are sometimes unable to control and properly distinguish between read/write functions under certain operating conditions. To mitigate the above issue and to improve device performance/robustness, some applications may require the static memory device to have a high read static noise margin (RSNM). However, meeting the high RSNM requirement may require a higher number of transistors in the static memory device, which may affect read/write speed or increase device cost.

SUMMARY

The present disclosure addresses at least the above limitations in existing static memory devices. Specifically, the present disclosure discloses a static random access memory (SRAM) having improved RSNM compared to existing static memory devices.

According to an embodiment of the inventive concept, a static random access memory is provided. The static random access memory includes: a first inverter and a second inverter, wherein an output terminal of the first inverter is connected to an input terminal of the second inverter, and an input terminal of the first inverter is connected to an output terminal of the second inverter; a first n-type metal-oxide-semiconductor (NMOS) transistor configured to control a write signal of the static random access memory, wherein the first NMOS transistor is connected to the input terminal of the first inverter, the output terminal of the second inverter, a write word line, and a write bit line; and a second NMOS transistor configured to control a read signal of the static random access memory, wherein the second NMOS transistor is connected to the output terminal of the first inverter, the input terminal of the second inverter, a read word line, and an internal line.

In some embodiments, the first inverter may further include a first p-type metal-oxide-semiconductor (PMOS) transistor and a third NMOS transistor, and the second inverter may further include a second PMOS transistor and a fourth NMOS transistor; and the first PMOS transistor and the second PMOS transistor may be pull-up transistors connected to a power supply terminal, and the third NMOS transistor and the fourth NMOS transistor may be pull-down transistors connected to a ground terminal.

In some embodiments, a gate of the first NMOS transistor may be connected to the write word line; a drain of the first NMOS transistor may be connected to the write bit line; and a source of the first NMOS transistor may be connected to a drain of the first PMOS transistor, a drain of the third NMOS transistor, a gate of the second PMOS transistor, and a gate of the fourth NMOS transistor.

In some embodiments, a gate of the second NMOS transistor may be connected to the read word line; a drain of the second NMOS transistor may be connected to the internal line; and a source of the second NMOS transistor may be connected to a gate of the first PMOS transistor, a gate of the third NMOS transistor, a drain of the second PMOS transistor, and a drain of the fourth NMOS transistor.

In some embodiments, a width of each of the third NMOS transistor and the fourth NMOS transistor may be the same as a width of the first NMOS transistor.

In some embodiments, a width of each of the third NMOS transistor and the fourth NMOS transistor may be the same as a width of the second NMOS transistor.

In some embodiments, a source of the first PMOS transistor and a source of the second PMOS transistor may be connected to the power supply terminal; a gate of the first PMOS transistor may be connected to a gate of the third NMOS transistor, and a gate of the second PMOS transistor may be connected to a gate of the fourth NMOS transistor; and a source of the third NMOS transistor and a source of the fourth NMOS transistor may be connected to the ground terminal.

In some embodiments, the static random access memory may further include n number of cells, and a gate of the first NMOS transistor in an i-th cell may be connected to an i-th write word line, a drain of the first NMOS transistor in the i-th cell may be connected to a j-th write bit line, a gate of the second NMOS in the i-th cell may be connected to an i-th read word line, and a drain of the second NMOS transistor in the i-th cell may be connected to a j-th internal line.

In some embodiments, each of i and j may be a number ranging from 0 to n−1.

In some embodiments, the j-th internal line may be connected to a j-th read bit line via a fifth NMOS transistor, the fifth NMOS transistor being configured to control a read signal selection among a column of cells.

In some embodiments, a gate of the fifth NMOS transistor may be connected to the j-th internal line, a drain of the fifth NMOS transistor may be connected to the j-th read bit line, and a source of the fifth NMOS transistor may be connected to ground when the static random access memory is in a read state.

In some embodiments, a gate of the fifth NMOS transistor may be connected to the j-th internal line, a drain of the fifth NMOS transistor may be connected to the j-th read bit line, and a source of the fifth NMOS transistor may be connected to a high voltage potential when the static random access memory is in a non-read state.

BRIEF DESCRIPTION OF THE DRAWINGS

The accompanying drawings, which are incorporated herein and constitute a part of the specification, illustrate different embodiments of the inventive concept and, together with the detailed description, serve to describe more clearly the inventive concept.

It is noted that in the accompanying drawings, for convenience of description, the dimensions of the components shown may not be drawn to scale. Also, same or similar reference numbers between different drawings represent the same or similar components.

DETAILED DESCRIPTION

Figure 1:
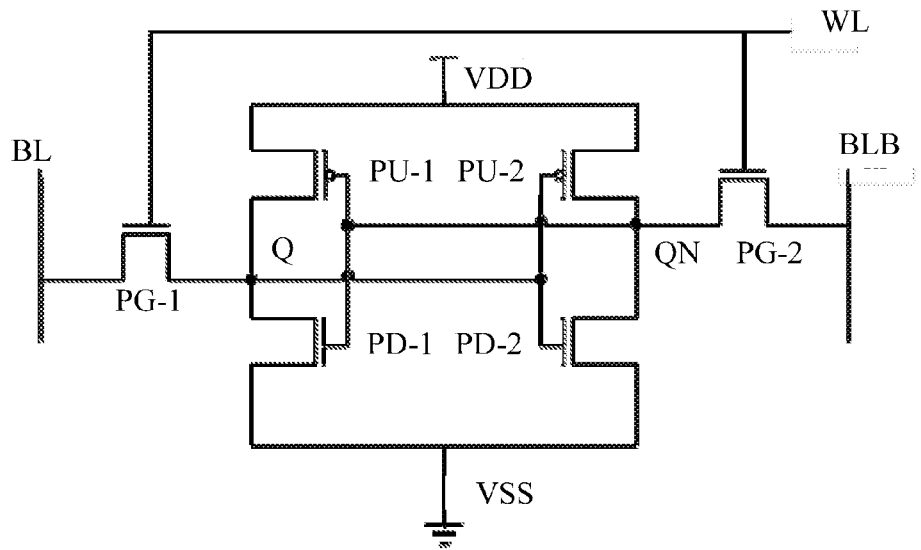
FIG. 1 is a schematic circuit diagram of a static random access memory.

Various embodiments of the inventive concept are next described in detail with reference to the accompanying drawings. It is noted that the following description of the different embodiments is merely illustrative in nature, and is not intended to limit the inventive concept, its application, or use. The relative arrangement of the components, and the numerical expressions and the numerical values set forth in these embodiments do not limit the scope of the inventive concept unless otherwise specifically stated. In addition, techniques, methods, and devices as known by those skilled in the art, although omitted in some instances, are intended to be part of the specification where appropriate. It should be noted that for convenience of description, the sizes of the elements in the drawings may not be drawn to scale.

It should be understood that when an element is referred to as "in", "adjacent to", "connected to", or "coupled to" another element, it can be directly on the other element, adjacent, connected or coupled to the other element. In some instances, one or more intervening elements may be present. In contrast, when an element is referred to as being "directly on", "directly adjacent to", "directly connected to", or "directly coupled to" another element, there are no intervening elements present. It will be understood that, although the terms "first," "second," "third," etc. may be used herein to describe various elements, the elements should not be limited by those terms. Instead, those terms are merely used to distinguish one element from another. Thus, a "first" element discussed below could be termed a "second" element without departing from the teachings of the present inventive concept. As used herein, the term "and/or" includes any and all combinations of one or more of the associated listed items.

The terminology used herein is for the purpose of describing particular embodiments and is not intended to limit the inventive concept. As used herein, the singular forms "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art, and should not be interpreted in an idealized or overly formal sense unless expressly so defined herein.

It should be understood that the inventive concept is not limited to the embodiments described herein. Rather, the inventive concept may be modified in different ways to realize different embodiments.

FIG. 1 is a schematic circuit diagram of a static random access memory (SRAM). Referring to FIG. 1, the SRAM includes a first pull-up transistor PU-1, a second pull-up transistor PU-2, a first pull-down transistor PD-1, a second pull-down transistor PD-2, a first pass gate transistor PG-1, a second pass gate transistor PG-2, a word line WL, and bit lines BL and BLB. The first and second pull-up transistors PU-1 and PU-2 are connected to a power supply terminal VDD, and the first and second pull-down transistors PD-1 and PD-2 are connected to a ground terminal VSS. The first pass gate transistor PG-1 is connected to the bit line BL, and the second pass gate transistor PG-2 is connected to the bit line bar BLB. The input/output terminals of the first pull-up transistor PU-1, first pass gate transistor PG-1, and first pull-down transistor PD-1, and the gates of the second pull-up transistor PU-2 and second pull-down transistor PD-2, are connected at a node Q. The input/output terminals of the second pull-up transistor PU-2, second pass gate transistor PG-2, and second pull-down transistor PD-2, and the gates of the first pull-up transistor PU-1 and first pull-down transistor PD-1, are connected at a node QN. The gates of the first and second pass gate transistors PG-1 and PG-2 are connected to the word line WL.

Figure 2:
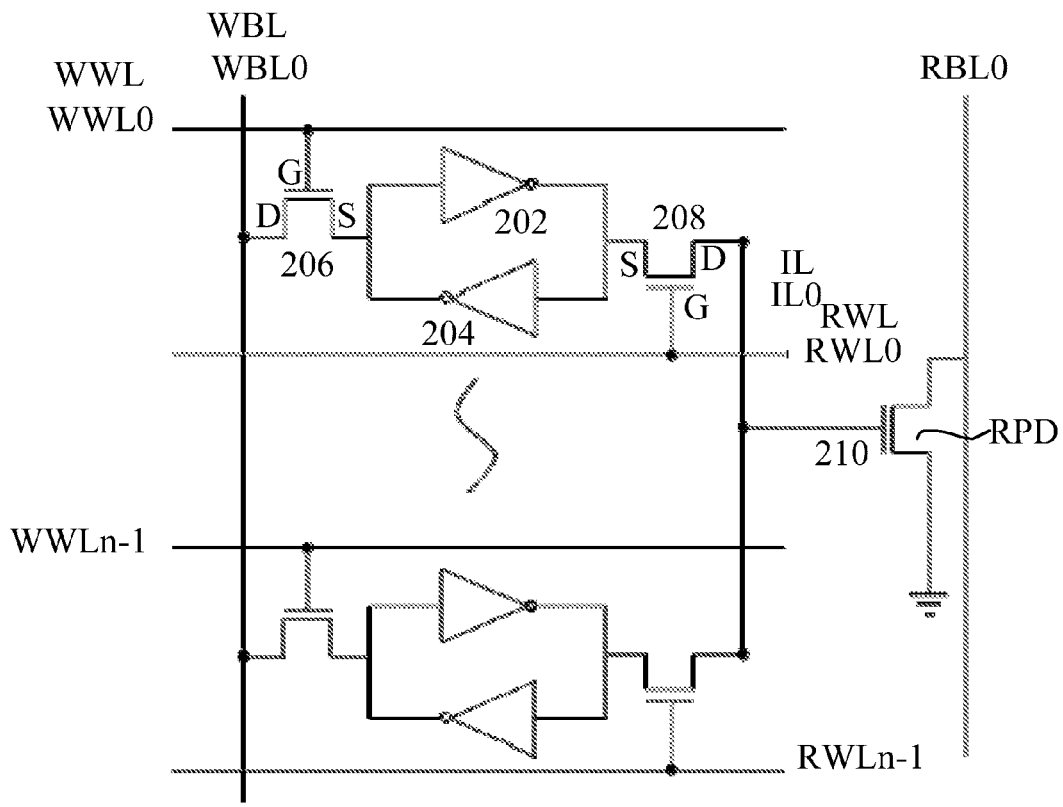
FIG. 2 is a schematic circuit diagram of a static random access memory according to an embodiment.

FIG. 2 illustrates a static random access memory (SRAM) according to an embodiment. Referring to FIG. 2, the exemplary SRAM includes a first inverter 202, a second inverter 204, a first n-type metal-oxide-semiconductor (NMOS) transistor 206, and a second NMOS transistor 208.

In some embodiments, the first inverter 202 may include a first p-type metal-oxide-semiconductor (PMOS) transistor and a third NMOS transistor. The exemplary SRAM may be controlled, for example, by controlling voltages applied to the first PMOS transistor and the third NMOS transistor of the first inverter 202.

As shown in FIG. 2, an output terminal of the first inverter 202 is connected to an input terminal of the second inverter 204, and an input terminal of the first inverter 202 is connected to an output terminal of the second inverter 204.

In some embodiments, the second inverter 204 may include a second PMOS transistor and a fourth NMOS transistor. The exemplary SRAM may be controlled, for example, by controlling voltages applied to the second PMOS transistor and fourth NMOS transistor of the second inverter 204.

In some embodiments, the first PMOS transistor and second PMOS transistor are pull-up transistors connected to a power supply terminal, and the third NMOS transistor and fourth NMOS transistor are pull-down transistors connected to a ground terminal.

The first NMOS transistor 206 is configured to control a write signal. The first NMOS transistor 206 may be connected to the input terminal of the first inverter 202, the output terminal of the second inverter 204, a write word line, and a write bit line. For example, as shown in FIG. 2, a gate G of the first NMOS transistor 206 is connected to a write word line WWL, a drain D of the first NMOS transistor 206 is connected to a write bit line WBL, and a source S of the first NMOS transistor 206 is connected to the input terminal of the first inverter 202 and the output terminal of the second inverter 204. The above circuit collectively constitutes a control circuit for controlling the write signal of the exemplary SRAM.

The second NMOS transistor 208 is configured to control a read signal. The second NMOS transistor 208 may be connected to the output terminal of the first inverter 202, the input terminal of the second inverter 204, a read word line, and an internal line. For example, as shown in FIG. 2, a gate G of the second NMOS transistor 208 is connected to a read word line RWL, a drain D of the second NMOS transistor 208 is connected to an internal line IL, and a source S of the second NMOS transistor 208 is connected to the output terminal of the first inverter 202 and the input terminal of the second inverter 204. The above circuit collectively constitutes a control circuit for controlling the read signal of the exemplary SRAM.

By using the first inverter, second inverter, and plurality of PMOS and NMOS transistors in the above configuration of FIG. 2 to control read/write signals, the read static noise margin (RSNM) can be improved in the exemplary SRAM. For example, the exemplary SRAM of FIG. 2 has improved RSNM compared to the SRAM of FIG. 1. In particular, the exemplary SRAM of FIG. 2 has improved RSNM compared to a conventional 6T SRAM cell.

Figure 3:
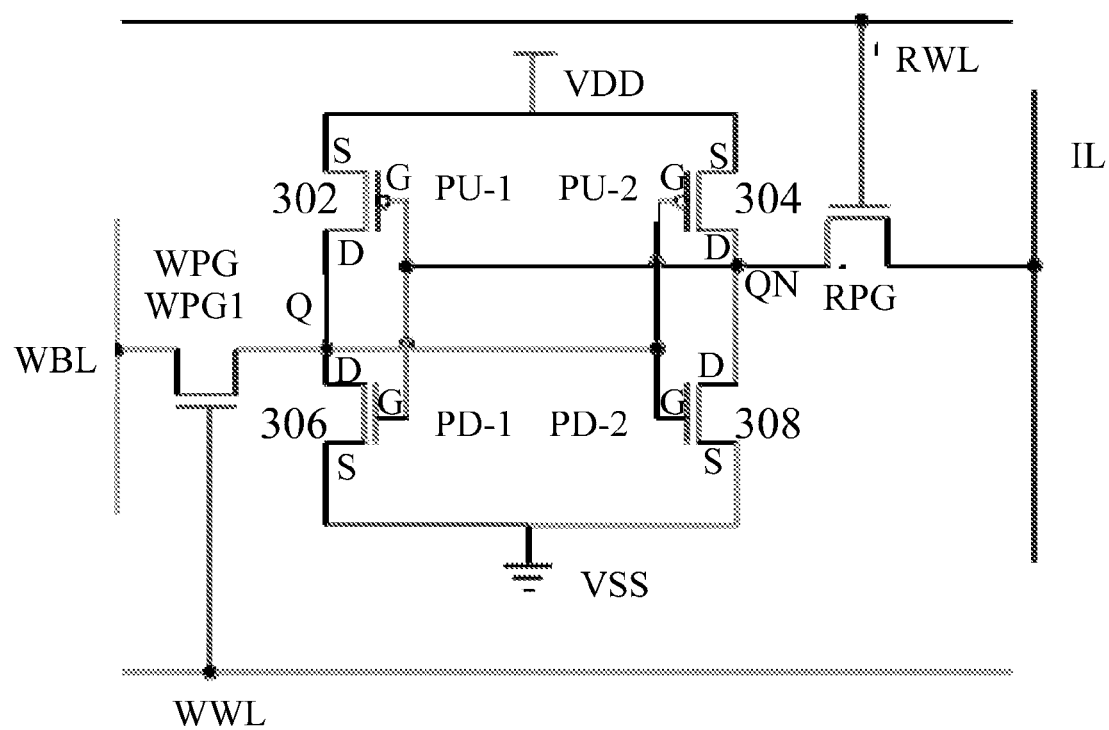
FIG. 3 is a schematic circuit diagram of a static random access memory according to another embodiment.

FIG. 3 illustrates a SRAM according to another embodiment. As previously described, the first inverter may include the first PMOS transistor and the third NMOS transistor, and the second inverter may include the second PMOS transistor and the fourth NMOS transistor, whereby the first PMOS transistor and second PMOS transistor are pull-up transistors (PU-1 and PU-2) connected to a power supply terminal, and the third NMOS transistor and fourth NMOS transistor are pull-down transistors (PD-1 and PD-2) connected to a ground terminal. For example, as shown in FIG. 3, a source S of a first PMOS transistor 302 and a source S of a second PMOS transistor 304 are pulled up and connected to a power supply terminal VDD, and a source S of a third NMOS transistor 306 and a source S of a fourth NMOS transistor 308 are pulled down and connected to a ground terminal VSS. The first inverter 202 in FIG. 2 may include the first PMOS transistor 302 and third NMOS transistor 306 in FIG. 3, and the second inverter 204 in FIG. 2 may include the second PMOS transistor 304 and fourth NMOS transistor 308 in FIG. 3.

In some embodiments, a gate of the first NMOS transistor may be connected to a write word line, and a drain of the first NMOS transistor may be connected to a write bit line. A source of the first NMOS transistor may be connected to a drain of the first PMOS transistor, a drain of the third NMOS transistor, a gate of the second PMOS transistor, and a gate of the fourth NMOS transistor.

For example, as shown in FIGS. 2 and 3, the gate G of the first NMOS transistor 206 is connected to a first write word line WWL0, and the drain D of the first NMOS transistor 206 is connected to a first write bit line WBL0. The source S of the first NMOS transistor 206 is connected to a drain D of the first PMOS transistor 302 in the first inverter 202, a drain D of the third NMOS transistor 306, a gate G of the second PMOS transistor 304 in the second inverter 204, and a gate G of the fourth NMOS transistor 308, at node Q. The above circuit collectively constitutes a control circuit for controlling the write signal of the exemplary SRAM. Specifically, the write function of the exemplary SRAM can be achieved by using the write word line WWL to control a write pass gate WPG (e.g., WPG1).

In some embodiments, a gate of the second NMOS transistor may be connected to a read word line, and a drain of the second NMOS transistor may be connected to an internal line. A source of the second NMOS transistor may be connected to a gate of the first PMOS transistor, a gate of the third NMOS transistor, a drain of the second PMOS transistor, and a drain of the fourth NMOS transistor.

For example, as shown in FIGS. 2 and 3, the gate G of the second NMOS transistor 208 is connected to a first read word line RWL0, and the drain D of the second NMOS transistor 208 is connected to a first internal line IL0. A source S of the second NMOS transistor 208 is connected to a gate G of the first PMOS transistor 302 of the first inverter 202, a gate G of the third NMOS transistor 306, a drain D of the second PMOS transistor 304 in the second inverter 204, and a drain D of the fourth NMOS transistor 308, at node QN. The above circuit collectively constitutes a control circuit for controlling the read signal of the exemplary SRAM. Specifically, the read function of the exemplary SRAM can be achieved by using the read word line RWL to control a read pass gate RPG and select a read pull down RPD signal.

Accordingly, by controlling and connecting the first NMOS transistor, second NMOS transistor, first PMOS transistor, third NMOS transistor, second PMOS transistor, and fourth NMOS transistor in the configuration illustrated in FIGS. 2 and 3, the control and read/write functions of the exemplary SRAM can be realized.

In some embodiments, a width of each of the third NMOS transistor and the fourth NMOS transistor may be the same as a width of the first NMOS transistor.

In some embodiments, a width of each of the third NMOS transistor and the fourth NMOS transistor may be the same as a width of the second NMOS transistor.

In some embodiments, a width of each of the third NMOS transistor and the fourth NMOS transistor may be the same as a width of the first NMOS transistor, and a width of each of the third NMOS transistor and the fourth NMOS transistor may be the same as a width of the second NMOS transistor. By modifying the dimensions (e.g., widths) of the transistors, the number of transistors in the exemplary SRAM may be reduced compared to a conventional SRAM having a same read static noise margin (RSNM). As previously mentioned, the exemplary SRAM has improved RSNM compared to a conventional SRAM (e.g., a 6T SRAM cell).

In some embodiments, the source of the first PMOS transistor and the source of the second PMOS transistor are connected to a power supply terminal, the gate of the first PMOS transistor is connected to the gate of the third NMOS transistor, the gate of the second PMOS transistor is connected to the gate of the fourth NMOS transistor, and the source of the third NMOS transistor and the source of the fourth NMOS transistor are connected to the ground terminal.

In some embodiments, the exemplary SRAM may include a plurality of cells. For example, the exemplary SRAM may include n number of cells. A gate of the first NMOS transistor in an i-th cell may be connected to an i-th write word line; a drain of the first NMOS transistor in the i-th cell may be connected to a j-th write bit line; a gate of the second NMOS in the i-th cell may be connected to an i-th read word line; and a drain of the second NMOS transistor in the i-th cell may be connected to a j-th internal line. In the above, i and j may be any number ranging from 0 to n−1.

For example, as shown in FIG. 2, the exemplary SRAM may include a plurality of cells ranging from a first cell to an (n−1) cell. In the first cell, the gate G of the first NMOS transistor 206 is connected to the first write word line WWL0, the drain D of the first NMOS transistor 206 is connected to the first write bit line WBL0, the gate G of the second NMOS transistor 208 is connected to the first read word line RWL0, and the drain D of the second NMOS transistor 208 is connected to the first internal line IL0. The (n−1) cell includes the same elements as the first cell, except the (n−1) cell is connected to an (n−1) write word line WWLn−1 and an (n−1) read word line RWLn−1.

In some embodiments, a j-th internal line may be connected to a j-th read bit line via a fifth NMOS transistor, whereby the fifth NMOS transistor may be used to control a read signal selection among a column of cells.

For example, as shown in FIG. 2, the first internal line IL0 is connected to a first read bit line RBL0 via a fifth NMOS transistor 210, whereby the fifth NMOS transistor 210 controls the Read Pull Down RPD signal to select a read signal among a column of cells.

In some embodiments, a j-th internal line may be connected to a gate of the fifth NMOS transistor 210, a drain of the fifth NMOS transistor 210 may be connected to a j-th read bit line, and a source of the fifth NMOS transistor 210 may be connected to ground (in a read state) or connected to a high voltage potential (in a non-read state).

For example, as shown in FIG. 2, the first internal line IL0 is connected to the gate G of the fifth NMOS transistor 210, the drain D of the fifth NMOS transistor 210 is connected to the first read bit line RBL0, and the source S of the fifth NMOS transistor 210 is connected to ground (in a read state) or connected to a high voltage potential (in a non-read state).

Embodiments of a static random access memory have been described in the foregoing description. To avoid obscuring the inventive concept, details that are well-known in the art may have been omitted. Nevertheless, those skilled in the art would be able to understand the implementation of the inventive concept and its technical details in view of the present disclosure.

The different embodiments of the inventive concept have been described with reference to the accompanying drawings. However, the different embodiments are merely illustrative and are not intended to limit the scope of the inventive concept. Furthermore, those skilled in the art would appreciate that various modifications can be made to the different embodiments without departing from the scope of the inventive concept.

What is claimed is:

1. A static random access memory comprising a plurality of cells, wherein each of the plurality of cells comprises:
    a first inverter and a second inverter, wherein an output terminal of the first inverter is connected to an input terminal of the second inverter, and an input terminal of the first inverter is connected to an output terminal of the second inverter;
    a first n-type metal-oxide-semiconductor (NMOS) transistor configured to control a write signal of the static random access memory, wherein the first NMOS transistor is connected to the input terminal of the first inverter, the output terminal of the second inverter, a write word line, and a write bit line; and
    a second NMOS transistor configured to control a read signal of the static random access memory, wherein the second NMOS transistor is connected to the output terminal of the first inverter, the input terminal of the second inverter, a read word line, and an internal line,
    wherein the internal line is connected to a read bit line via a fifth NMOS transistor,
    wherein a gate of the fifth NMOS transistor is connected to the internal line, and a drain of the fifth NMOS transistor is connected to the read bit line, and
    wherein gates of a plurality of fifth NMOS transistors of the plurality of cells are commonly connected to the internal line.

2. The static random access memory according to claim 1, wherein the first inverter further comprises a first p-type metal-oxide-semiconductor (PMOS) transistor and a third NMOS transistor, and the second inverter further comprises a second PMOS transistor and a fourth NMOS transistor; and
    wherein the first PMOS transistor and the second PMOS transistor are pull-up transistors connected to a power supply terminal, and the third NMOS transistor and the fourth NMOS transistor are pull-down transistors connected to a ground terminal.

3. The static random access memory according to claim 2, wherein:
    a gate of the first NMOS transistor is connected to the write word line;
    a drain of the first NMOS transistor is connected to the write bit line; and
    a source of the first NMOS transistor is connected to a drain of the first PMOS transistor, a drain of the third NMOS transistor, a gate of the second PMOS transistor, and a gate of the fourth NMOS transistor.

4. The static random access memory according to claim 2, wherein:
    a gate of the second NMOS transistor is connected to the read word line;
    a drain of the second NMOS transistor is connected to the internal line; and
    a source of the second NMOS transistor is connected to a gate of the first PMOS transistor, a gate of the third NMOS transistor, a drain of the second PMOS transistor, and a drain of the fourth NMOS transistor.

5. The static random access memory according to claim 2, wherein a width of each of the third NMOS transistor and the fourth NMOS transistor is the same as a width of the first NMOS transistor.

6. The static random access memory according to claim 2, wherein a width of each of the third NMOS transistor and the fourth NMOS transistor is the same as a width of the second NMOS transistor.

7. The static random access memory according to claim 2, wherein a source of the first PMOS transistor and a source of the second PMOS transistor are connected to the power supply terminal;
    a gate of the first PMOS transistor is connected to a gate of the third NMOS transistor, and a gate of the second PMOS transistor is connected to a gate of the fourth NMOS transistor; and
    a source of the third NMOS transistor and a source of the fourth NMOS transistor are connected to the ground terminal.

8. The static random access memory according to claim 1, wherein the static random access memory further comprises n number of cells, and wherein:
    a gate of the first NMOS transistor in an i-th cell is connected to an i-th write word line;
    a drain of the first NMOS transistor in the i-th cell is connected to a j-th write bit line;
    a gate of the second NMOS in the i-th cell is connected to an i-th read word line; and
    a drain of the second NMOS transistor in the i-th cell is connected to a j-th internal line.

9. The static random access memory according to claim 8, wherein each of i and j is a number ranging from 0 to n−1.

10. The static random access memory according to claim 8, wherein the j-th internal line is connected to a j-th read bit line via the fifth NMOS transistor, the fifth NMOS transistor being configured to control a read signal selection among a column of cells.

11. The static random access memory according to claim 10, wherein the gate of the fifth NMOS transistor is connected to the j-th internal line, the drain of the fifth NMOS transistor is connected to the j-th read bit line, and a source of the fifth NMOS transistor is connected to a ground when the static random access memory is in a read state.

12. The static random access memory according to claim 10, wherein the gate of the fifth NMOS transistor is connected to the j-th internal line, the drain of the fifth NMOS transistor is connected to the j-th read bit line, and a source of the fifth NMOS transistor is connected to a high voltage potential when the static random access memory is in a non-read state.

\* \* \* \* \*